(12) United States Patent
Parikh et al.

(10) Patent No.: US 12,334,394 B2
(45) Date of Patent: Jun. 17, 2025

(54) METHODS AND APPARATUS FOR SELECTIVE ETCH STOP CAPPING AND SELECTIVE VIA OPEN FOR FULLY LANDED VIA ON UNDERLYING METAL

(71) Applicant: Applied Materials, Inc., Santa Clara, CA (US)

(72) Inventors: Suketu Parikh, San Jose, CA (US); Mihaela A. Balseanu, Santa Clara, CA (US); Bhaskar Jyoti Bhuyan, Milpitas, CA (US); Ning Li, San Jose, CA (US); Mark Joseph Saly, Milpitas, CA (US); Aaron Michael Dangerfield, San Jose, CA (US); David Thompson, Santa Clara, CA (US); Abhijit B. Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 533 days.

(21) Appl. No.: 17/719,502

(22) Filed: Apr. 13, 2022

(65) Prior Publication Data
US 2023/0010568 A1 Jan. 12, 2023

Related U.S. Application Data

(60) Provisional application No. 63/219,513, filed on Jul. 8, 2021.

(51) Int. Cl.
*H01L 21/768* (2006.01)
*H01L 21/02* (2006.01)
*H01L 21/311* (2006.01)

(52) U.S. Cl.
CPC .. *H01L 21/76834* (2013.01); *H01L 21/02126* (2013.01); *H01L 21/0217* (2013.01);
(Continued)

(58) Field of Classification Search
None
See application file for complete search history.

(56) References Cited

U.S. PATENT DOCUMENTS

| 5,885,425 A | 3/1999 | Hsieh et al. |
| 7,732,329 B2 | 6/2010 | Vasilev |

(Continued)

OTHER PUBLICATIONS

International Search Report for PCT/US2022/024726, dated Aug. 5, 2022.

*Primary Examiner* — Asok K Sarkar
(74) *Attorney, Agent, or Firm* — Moser Taboada

(57) ABSTRACT

Methods and apparatus for processing a substrate are provided herein. For example, a method of processing a substrate comprises a) removing oxide from a metal layer disposed in a dielectric layer on the substrate disposed in a processing chamber, b) selectively depositing a self-assembled monolayer (SAM) on the metal layer using atomic layer deposition, c) depositing a precursor while supplying water to form one of an aluminum oxide (AlO) layer on the dielectric layer or a low-k dielectric layer on the dielectric layer, d) supplying at least one of hydrogen ($H_2$) or ammonia ($NH_3$) to remove the self-assembled monolayer (SAM), and e) depositing one of a silicon oxycarbonitride (SiOCN) layer or a silicon nitride (SiN) layer atop the metal layer and the one of the aluminum oxide (AlO) layer on the dielectric layer or the low-k dielectric layer on the dielectric layer.

20 Claims, 6 Drawing Sheets

(52) U.S. Cl.
CPC .. *H01L 21/02178* (2013.01); *H01L 21/02205* (2013.01); *H01L 21/31111* (2013.01)

(56) References Cited

U.S. PATENT DOCUMENTS

| | | |
|---|---|---|
| 9,515,166 B2 | 12/2016 | Nemani et al. |
| 2008/0268154 A1* | 10/2008 | Kher ..................... C23C 16/56 |
| | | 427/255.34 |
| 2012/0052681 A1 | 3/2012 | Marsh |
| 2012/0135273 A1 | 5/2012 | Horng et al. |
| 2014/0038311 A1 | 2/2014 | Kim et al. |
| 2020/0090924 A1 | 3/2020 | Wu et al. |
| 2020/0357989 A1 | 11/2020 | Adusumilli et al. |
| 2021/0082802 A1* | 3/2021 | Huang .............. H01L 21/76834 |
| 2021/0082814 A1 | 3/2021 | Lee et al. |
| 2021/0098290 A1 | 4/2021 | Hsueh et al. |

\* cited by examiner

METHODS AND APPARATUS FOR SELECTIVE ETCH STOP CAPPING AND SELECTIVE VIA OPEN FOR FULLY LANDED VIA ON UNDERLYING METAL

CROSS-REFERENCE TO RELATED APPLICATIONS

This application claims benefit of U.S. provisional patent application Ser. No. 63/219,513, filed Jul. 8, 2021, the entire contents of which is incorporated herein by reference.

FIELD

Embodiments of the present disclosure generally relate to methods and apparatus for processing substrates, and more particularly, to methods and apparatus for selective etch stop capping and selective via open for fully landed via on underlying metal.

BACKGROUND

Methods and apparatus for fabricating dual damascene structure (e.g., copper (Cu)) are known. For example, the dual damascene structure is, typically, fabricated using one or more deposition processes for depositing a patterned layer atop an underlying dielectric layer in which one or more metal layers (e.g., interconnects) are disposed. Next, an etch process is used to form one or more vias open to the one or more metal layers. During the etch process, however, the one or more vias (e.g., an unlanded via) can sometimes expose the underlying dielectric layer, which, in turn, can lead to shorts occurring.

SUMMARY

Methods and apparatus for processing a substrate are provided herein. In some embodiments, a method of processing a substrate includes a) removing oxide from a metal layer disposed in a dielectric layer on the substrate disposed in a processing chamber, b) selectively depositing a self-assembled monolayer (SAM) on the metal layer using atomic layer deposition, c) depositing a precursor while supplying water to form one of an aluminum oxide (AlO) layer on the dielectric layer or a low-k dielectric layer on the dielectric layer, d) supplying at least one of hydrogen ($H_2$) or ammonia ($NH_3$) to remove the self-assembled monolayer (SAM), and e) depositing one of a silicon oxycarbonitride (SiOCN) layer or a silicon nitride (SiN) layer atop the metal layer and the one of the aluminum oxide (AlO) layer on the dielectric layer or the low-k dielectric layer on the dielectric layer.

In accordance with at least some embodiments, an apparatus configured for fabricating dual damascene on a substrate includes a dielectric layer, a metal layer disposed in the dielectric layer, one of an aluminum oxide (AlO) layer on the dielectric layer or a low-k dielectric layer on the dielectric layer, one of a silicon oxycarbonitride (SiOCN) layer or a silicon nitride (SiN) layer atop the metal layer and the one of the aluminum oxide (AlO) layer on the dielectric layer or the low-k dielectric layer on the dielectric layer, and a via landed to expose at least one of the metal layer or the one of the aluminum oxide (AlO) layer on the dielectric layer or the low-k dielectric layer on the dielectric layer, without exposing the dielectric layer.

In accordance with at least some embodiments, an integrated tool includes a plurality of processing chambers configured to a) remove oxide from a metal layer disposed in a dielectric layer on a substrate disposed in a processing chamber, b) selectively deposit a self-assembled monolayer (SAM) on the metal layer using atomic layer deposition, c) deposit a precursor while supplying water to form one of an aluminum oxide (AlO) layer on the dielectric layer or a low-k dielectric layer on the dielectric layer, d) supply at least one of hydrogen ($H_2$) or ammonia ($NH_3$) to remove the self-assembled monolayer (SAM), and e) deposit one of a silicon oxycarbonitride (SiOCN) layer or a silicon nitride (SiN) layer atop the metal layer and the one of the aluminum oxide (AlO) layer on the dielectric layer or the low-k dielectric layer on the dielectric layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
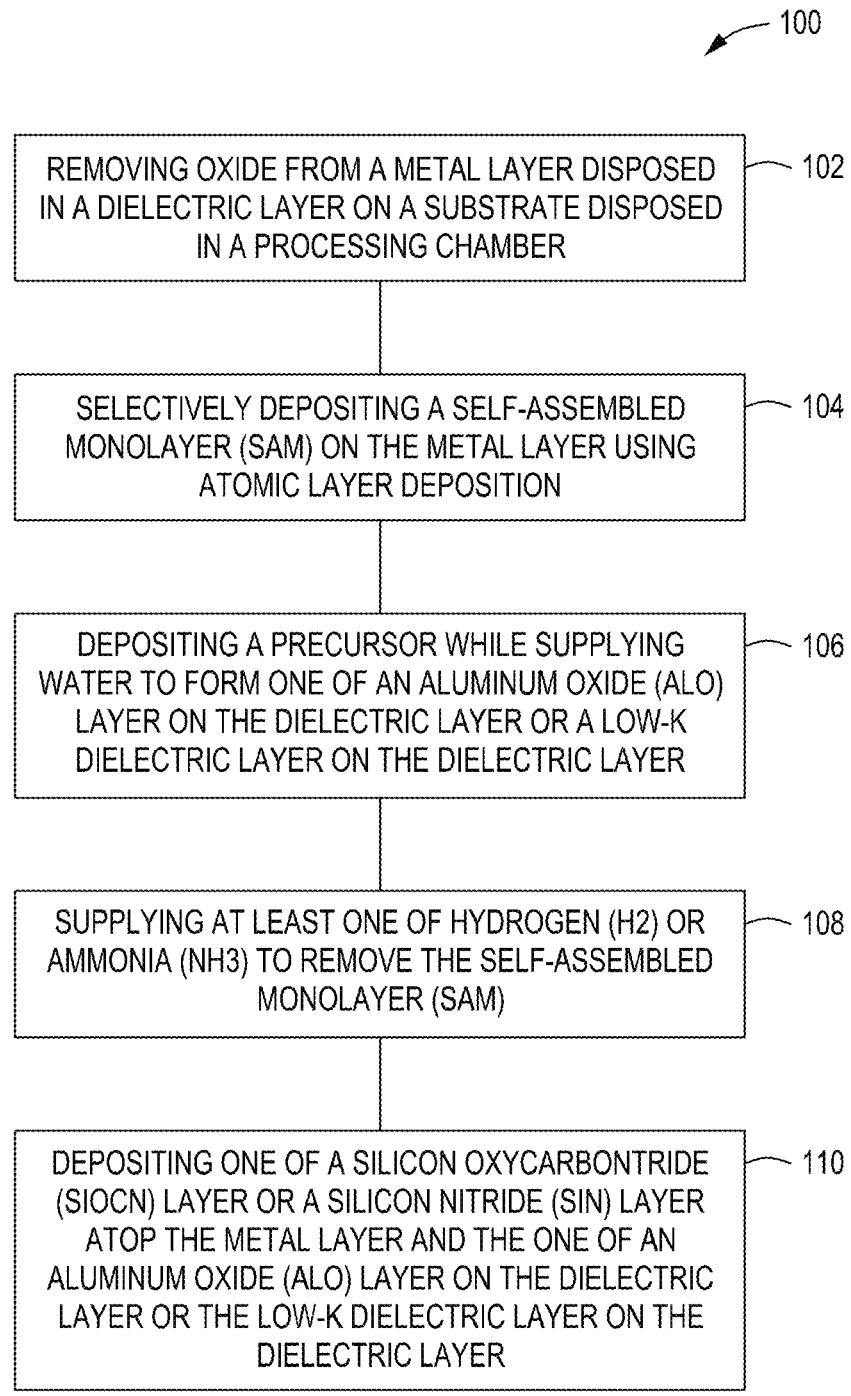
FIG. 1 is a method of processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a processing a substrate are provided herein. For example, in at least some embodiments, methods can include removing oxide from a metal layer disposed in a dielectric layer. Next, a self-assembled monolayer (SAM) can be deposited on the metal layer. Next, a precursor can be deposited while supplying water to form one of an aluminum oxide (AlO) layer on the dielectric layer or a low-k dielectric layer on the dielectric layer. Thereafter, at least one of hydrogen ($H_2$) or ammonia ($NH_3$) can be supplied to remove the self-assembled monolayer (SAM). Subsequently, one of a silicon oxycarbide (SiOC) layer or a silicon nitride (SiN) layer can be deposited atop the metal layer and the one of an aluminum oxide (AlO) layer on the dielectric layer or the low-k dielectric layer on the dielectric layer. The methods and apparatus described herein allows for vias to land on/expose metal, without shorting (e.g., without landing on/exposing the dielectric layer) and allows enlargement (e.g., about 25%) of the via without shorting, thus increasing cross sectional area of contact and providing lower via resistance (e.g., about 25% to about 50%).

FIG. 1 is a method of processing a substrate, and FIGS. 2A-3F are diagrams of substrates, in accordance with at least some embodiments of the present disclosure.

The method 100 may be performed in the tool 400 including any suitable processing chambers configured for one or more of physical vapor deposition (PVD), chemical vapor deposition (CVD) and/or atomic layer deposition (ALD), such as plasma enhanced ALD or thermal ALD (e.g., no plasma formation). Exemplary processing systems that may be used to perform the inventive methods disclosed herein may include the line of processing systems commercially available from Applied Materials, Inc., of Santa Clara, California. Other processing chambers, including those from other manufacturers, may also be suitably used in connection with the teachings provided herein.

Figure 4:
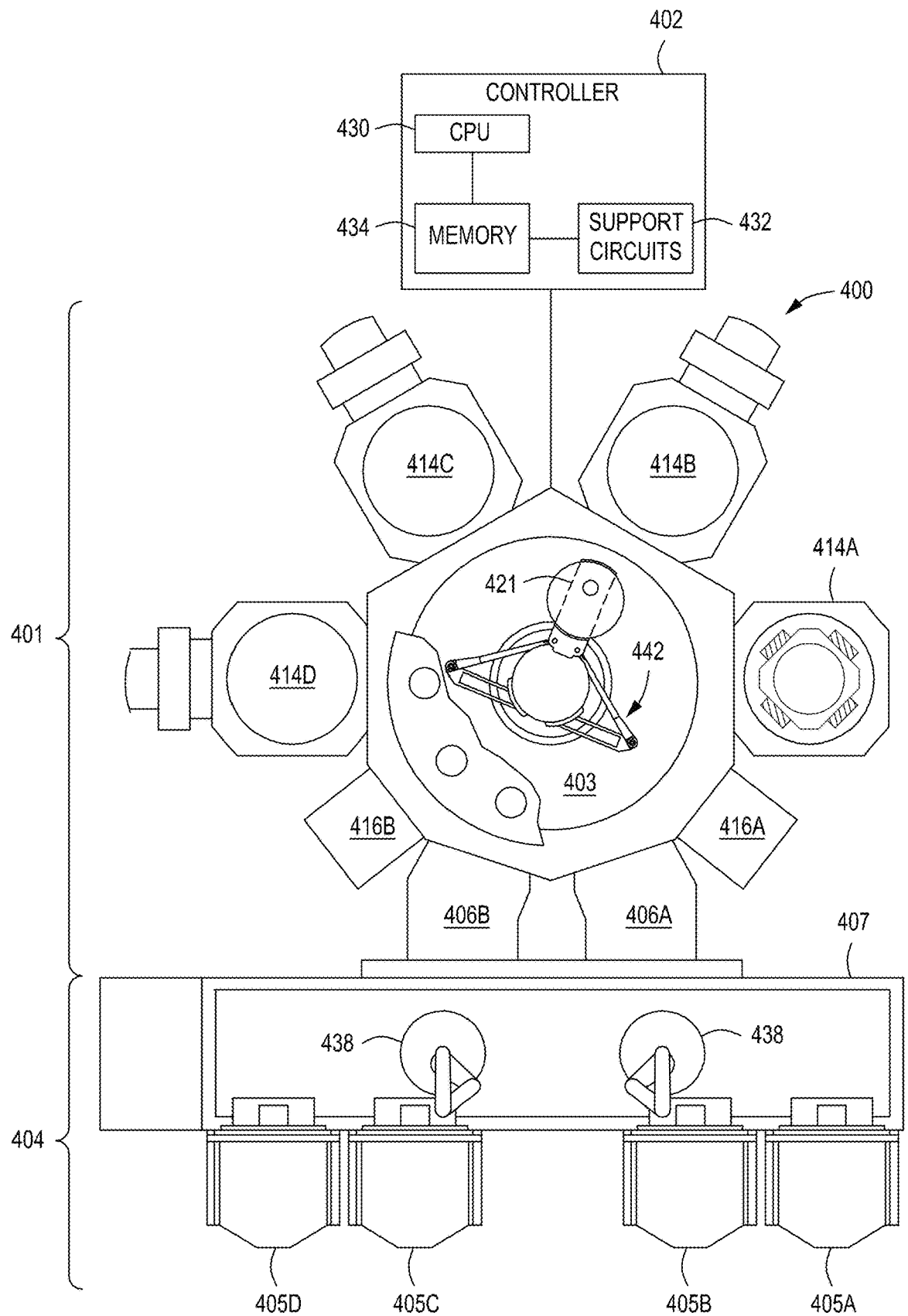
FIG. 4 is a diagram of an integrated tool, in accordance with at least one embodiment of the present disclosure.

The tool 400 can be embodied in individual process chambers that may be provided in a standalone configuration or as part of a cluster tool, for example, an integrated tool described below with respect to FIG. 4. Examples of the integrated tool include the line of integrated tools, available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of the tungsten liner layer or other portions of the substrate.

The integrated tool includes processing platform 401 (e.g., a vacuum-tight processing platform), a factory interface 404, and a system controller 402. The processing platform 401 comprises multiple processing chambers, such as 414A, 414B, 414C, and 414D operatively coupled to a transfer chamber 403 (a vacuum substrate transfer chamber). The factory interface 404 is operatively coupled to the transfer chamber 403 by one or more load lock chambers (two load lock chambers, such as 406A and 406B shown in FIG. 4).

In some embodiments, the factory interface 404 comprises at least one docking station 407, a factory interface robot 438 to facilitate the transfer of one or more semiconductor substrates (wafers). The at least one docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B.

Each of the load lock chambers 406A and 406B have a first port coupled to the factory interface 404 and a second port coupled to the transfer chamber 403. The load lock chamber 406A and 406B are coupled to a pressure control system (not shown) which pumps down and vents the load lock chambers 406A and 406B to facilitate passing the substrates between the vacuum environment of the transfer chamber 403 and the substantially ambient (e.g., atmospheric) environment of the factory interface 404. The transfer chamber 403 has a vacuum robot 442 disposed within the transfer chamber 403. The vacuum robot 442 is capable of transferring the substrates 421 between the load lock chamber 406A and 406B and the processing chambers 414A, 414B, 414C, and 414D.

In some embodiments, processing chambers 414A, 414B, 414C, and 414D comprise at least an ALD chamber, a CVD chamber, a PVD chamber, an e-beam deposition chamber, and/or an electroplating, electroless (EEP) deposition chamber.

In some embodiments, one or more optional service chambers (shown as 416A and 416B) may be coupled to the transfer chamber 403. The service chambers 416A and 416B may be configured to perform other substrate processes, such as degassing, bonding, chemical mechanical polishing (CMP), wafer cleaving, etching, plasma dicing, orientation, substrate metrology, cool down and the like.

The system controller 402 controls the operation of the tool 400 using a direct control of the process chambers 414A, 414B, 414C, and 414D or alternatively, by controlling the computers (or controllers) associated with the process chambers 414A, 414B, 414C, and 414D and the tool 400. In operation, the system controller 402 enables data collection and feedback from the respective chambers and systems to optimize performance of the tool 400. The system controller 402 generally includes a central processing unit 430, a memory 434, and a support circuit 432. The central processing unit 430 may be any form of a general-purpose computer processor that can be used in an industrial setting. The support circuit 432 is conventionally coupled to the central processing unit 430 and may comprise a cache, clock circuits, input/output subsystems, power supplies, and the like. Software routines, such as processing methods as described above may be stored in the memory 434 (e.g., non-transitory computer readable storage medium) and, when executed by the central processing unit 430, transform the central processing unit 430 into a specific purpose computer. The software routines may also be stored and/or executed by a second controller (not shown) that is located remotely from the tool 400.

Figure 2A:
FIGS. 2A-2F are diagrams of a substrate, in accordance with at least some embodiments of the present disclosure.
Figure 2B:
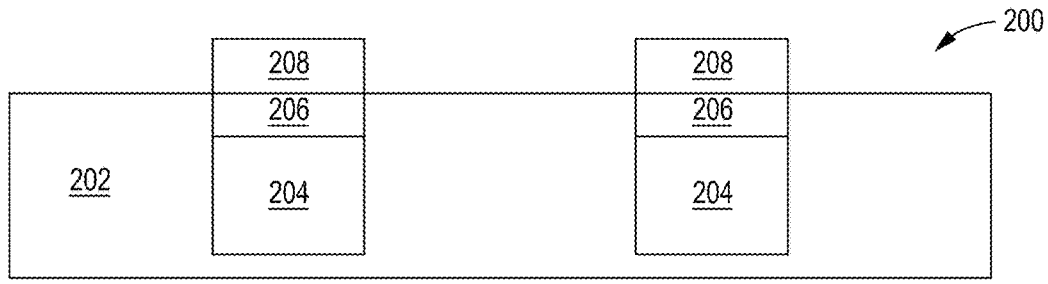

With reference again to FIG. 1, initially one or more substrates, e.g., a semiconductor wafer, flat panel, solar panel, polymer substrate, or the like may be loaded into one or more of the Four FOUPS, such as FOUPS 405A, 405B, 405C, and 405D (FIG. 2A). In at least some embodiments, the substrate 200 can comprise a dielectric layer 202. The dielectric layer 202 can comprise low-k dielectric material (e.g., silicon oxycarbonitride (SiOC), oxide, silicon nitride (SiN), etc. The substrate 200 can also comprise a metal layer 204. For example, the metal layer can be made from at least one of cobalt (Co), copper (Cu), or other suitable metal (e.g., titanium (Ti), tungsten (W), etc.). In at least some embodiments, the metal layer 204 can be made from copper (Cu). Additionally, a capping layer 206 can, optionally, be deposited on the metal layer. For example, the capping layer 206 can be made from copper (Cu), cobalt (Co) or other suitable metal (e.g., titanium (Ti), tungsten (W), etc.). In at least some embodiments, the capping layer 206 can be made from cobalt (Co). The capping layer functions to improve EM. For illustrative purposes, the substrate 200 is shown with the capping layer 206 deposited on the metal layer 204.

At 102, the method 100 comprises removing oxide from a metal layer disposed in a dielectric layer on a substrate disposed in a processing chamber. For example, the factory interface robot 438 can transfer the substrate 200 from the factory interface 404 to the processing platform 401 through, for example, the load lock chamber 406A. The vacuum robot 442 can transfer the substrate 200 from the load lock chamber 406A to and from one or more of the processing chambers 414A-414D and/or the service chambers 416A and 416B to process the substrate.

For example, at 102, the substrate 200 can be transferred to the processing chamber 414A to perform one or more processes to remove the oxide (e.g., metal oxide) from the metal layer 204, a top surface of the dielectric layer 202, and/or the capping layer 206, if used. In the illustrated embodiment, the oxide is shown removed from the metal layer 204, the top surface of the dielectric layer 202, and the capping layer 206. At 102, the removal process (e.g., to remove/reduce Co and/or Cu oxide) can comprise treating the substrate with hydrogen ($H_2$) plasma, ammonia ($NH_3$) plasma, or $N_2/H_2$ plasma, or soaking the substrate using a thermal process (e.g., at about 200° C. to about 400° C.).

Next, at 104 the method 100 comprises selectively depositing a self-assembled monolayer (SAM) on the metal layer using atomic layer deposition. For example, 104 can be performed in the processing chamber 414A or can be transferred to one of the other processing chambers to perform 104 (e.g., without vacuum break). For example, the self-assembled monolayer (SAM) 208 can be deposited over the metal layer 204 or the capping layer 206 using CVD (e.g., vapor or liquid phase). Similarly, a self-assembled monolayer (SAM) 308 can be deposited over a metal layer 304 or a capping layer 306 of a substrate 300 (FIGS. 3A-3C) using CVD (e.g., vapor or liquid phase) The self-assembled monolayer (SAM) 208 blocks deposition of the relatively large molecules (e.g., on the metal layer 204 and/or the capping layer 206) present during deposition of a precursor at 106. In at least some embodiments, one or more process parameters can be controlled for depositing the self-assembled monolayer (SAM) 208 over the metal layer 204 or the capping layer 206. For example, in at least some embodiments, vapor pressure and/or temperature can be controlled to selectively deposit the self-assembled monolayer (SAM) 208 over the metal layer 204 or the capping layer 206.

Figure 2C:
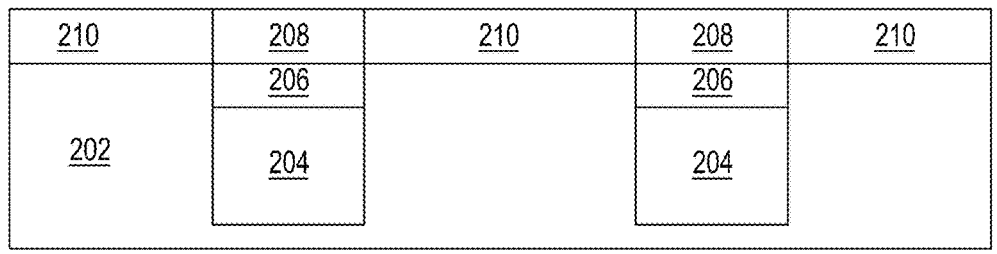
Figure 3A:
FIGS. 3A-3F are diagrams of a substrate, in accordance with at least some embodiments of the present disclosure.
Figure 3B:
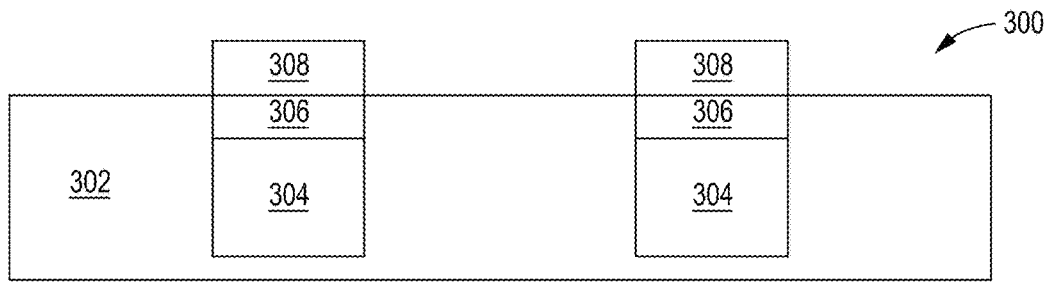
Figure 3C:
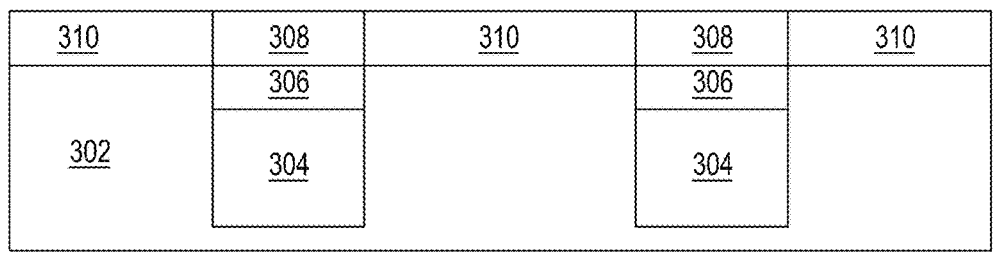

For example, at 106, the method 100 comprises depositing a precursor while supplying water to form one of an aluminum oxide (AlO) layer on the dielectric layer or a low-k dielectric layer on the dielectric layer. For example, the precursor can comprise aluminum (Al) (e.g., trimethylaluminum (TMA), neo pentene Al, etc.). In at least some embodiments, $NH_3$ can be supplied during 106. In at least some embodiments, one or more additional oxides (e.g., hafnium oxide, zirconium oxide, and/or zinc oxide) can be used to selectively deposit on the dielectric layer for application of selective etch stop, which can prevent next layer via to open only on metal, as described in greater detail below. 106 can be performed using CVD or ALD. For example, in at least some embodiments, 106 can be performed using ALD in the processing chamber 414A or can be transferred to one of the other processing chambers to perform 106 (e.g., the processing chamber 414B, without vacuum break). At 106, a temperature of the substrate can be maintained at about 200° C. to about 400° C. In at least some embodiments, at 106, an aluminum oxide (AlO) layer 210 can be deposited on the dielectric layer 202 (FIG. 2C). Similarly, in at least some embodiments, a low-k dielectric layer 310 (e.g., trimethylsilane or DMDM) can be selectively deposited on a dielectric layer 302 of the substrate 300 (FIG. 3C).

Next, at 108, the method 100 comprises supplying at least one of hydrogen ($H_2$) or ammonia ($NH_3$) to remove the self-assembled monolayer (SAM). For example, 108 can be performed in the processing chamber 414A or can be transferred to one of the other processing chambers to perform 108 (e.g., without vacuum break). In at least some embodiments, at 108 the capping layer can also be treated (e.g., for reduction of the capping layer). In at least some embodiments, after 108, 102 can be performed again to remove any metal oxide present on the metal layer 204 or the capping layer 206. In at least some embodiments, the method 100 comprises purging the at least one of hydrogen ($H_2$) or ammonia ($NH_3$) from a processing volume of the processing chamber. Additionally, prior to proceeding to 110 of the method 100, in at least some embodiments, 102 to 108 can be repeated (cyclically) for a predetermined amount of times. For example, in at least some embodiments, the predetermined amount of time is 1- to about 10 times.

In at least some embodiments, a nitridation process can be performed on the aluminum oxide (AlO) layer 210 and the low-k dielectric layer 310 (e.g., to form a dual film) prior to proceeding to 110 of the method 100.

Figure 2D:
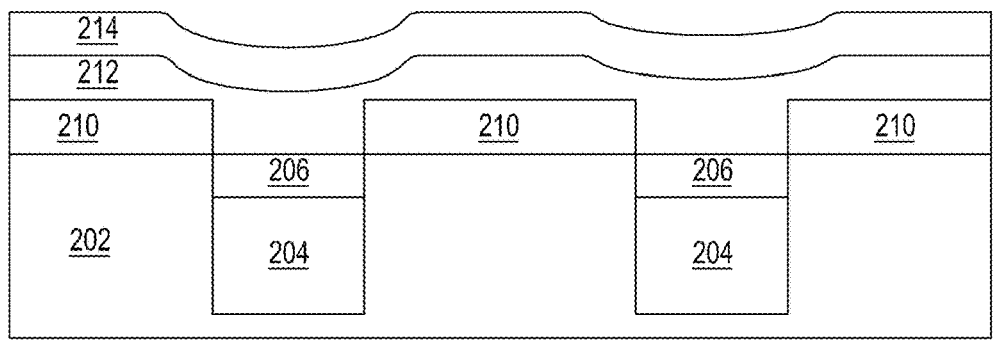
Figure 3D:
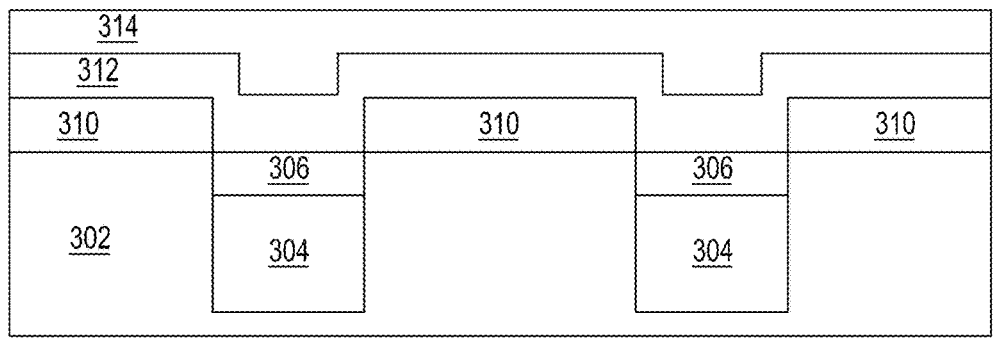

Next, at 110, the method 100 comprises depositing one of a silicon oxycarbonitride (SiOCN) layer or a silicon nitride (SiN) layer atop the metal layer and the one of an aluminum oxide (AlO) layer on the dielectric layer or the low-k dielectric layer on the dielectric layer. 110 can be performed in the processing chamber 414A or can be transferred to one of the other processing chambers to perform 110 using CVD and/or ALD (e.g., the processing chamber 414C, without vacuum break). For example, at 110 silicon oxycarbonitride (SiOCN) layer 212 (or a silicon nitride (SiN) layer) can be deposited atop the metal layer 204 or the capping layer 206 and the aluminum oxide (AlO) layer 210 on the dielectric layer 202 (FIG. 2D). Similarly, a silicon oxycarbonitride (SiOCN) layer 312 (or a silicon nitride (SiN) layer) can be deposited atop the metal layer 304 or the capping layer 306 and the low-k dielectric layer 310 on the dielectric layer 302 (FIG. 3D).

In at least some embodiments, after 110, the method 100 comprises optionally depositing an aluminum oxide (AlO) layer 214 atop the silicon oxycarbonitride (SiOCN) layer 212 (or the silicon nitride (SiN) layer). Similarly, an aluminum oxide (AlO) layer 314 can be deposited atop the silicon oxycarbonitride (SiOCN) layer 312 (or the silicon nitride (SiN) layer). In at least some embodiments, the aluminum oxide (AlO) layer 314 can be silicon carbon nitride (SiCN).

Figure 2E:
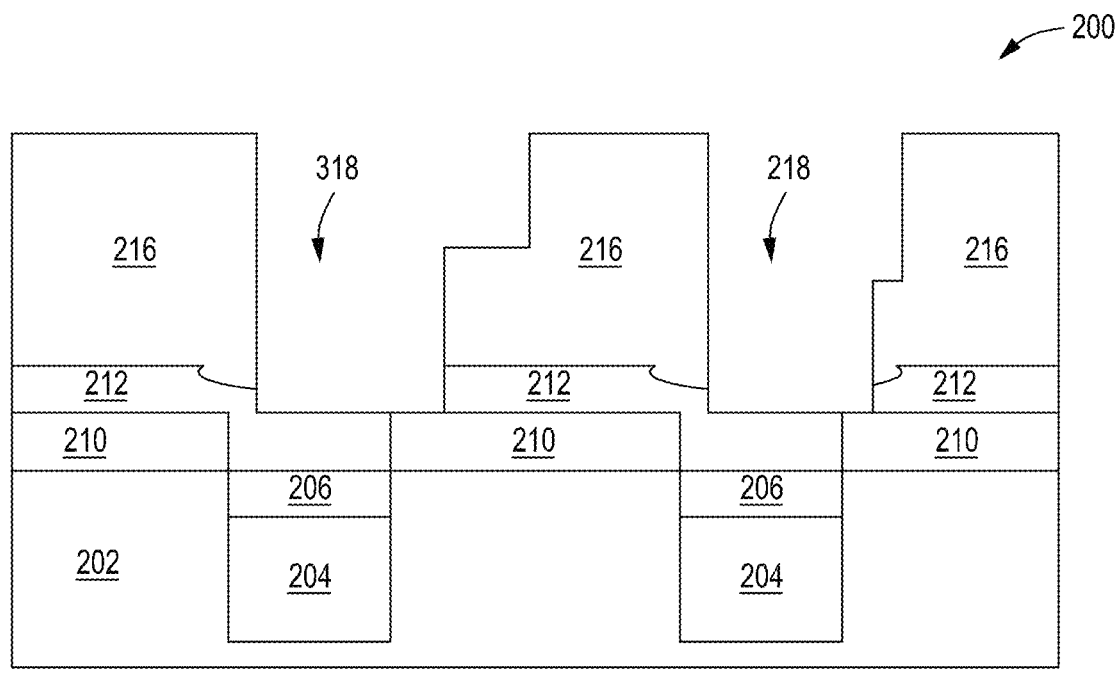
Figure 2F:
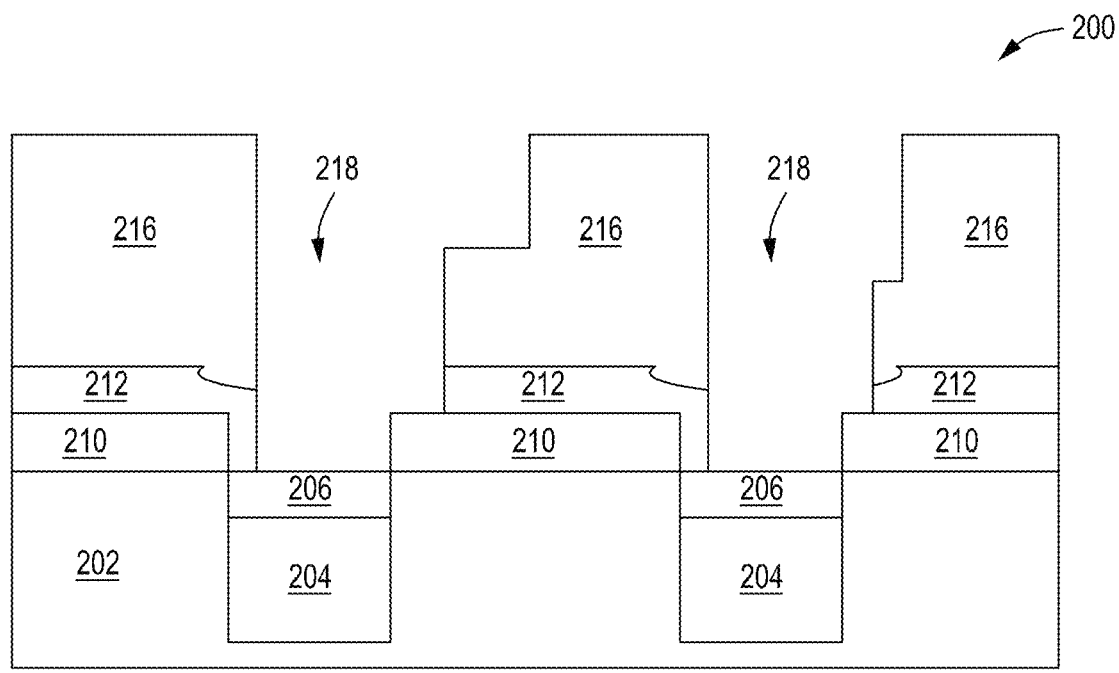
Figure 3E:
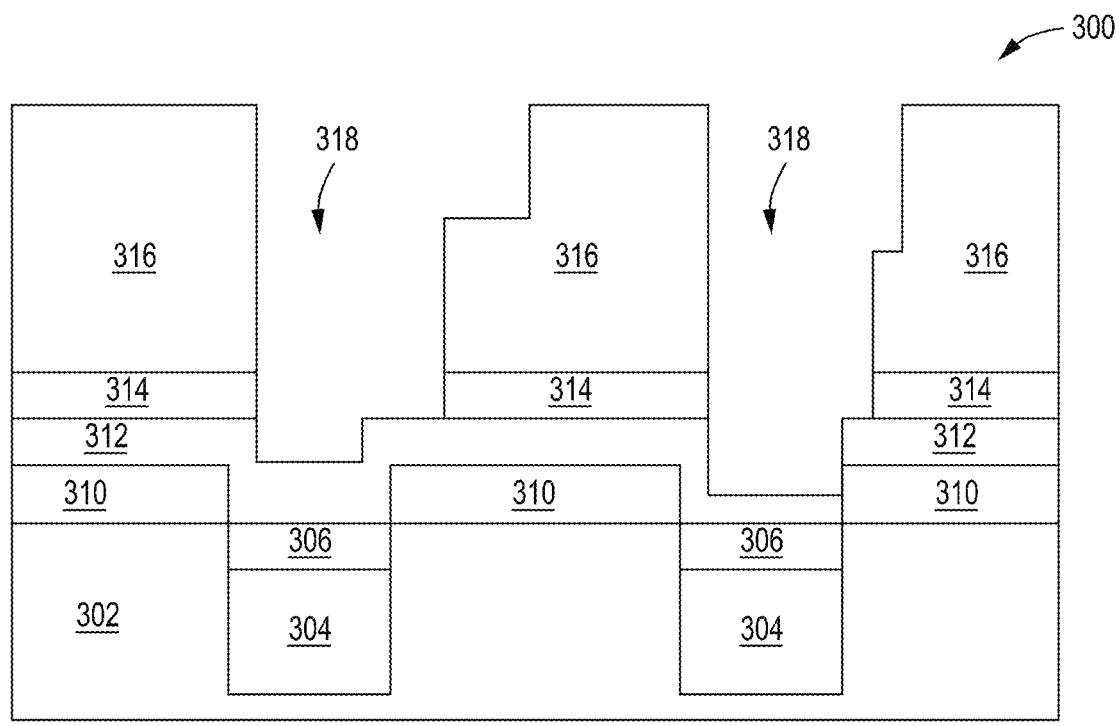
Figure 3F:
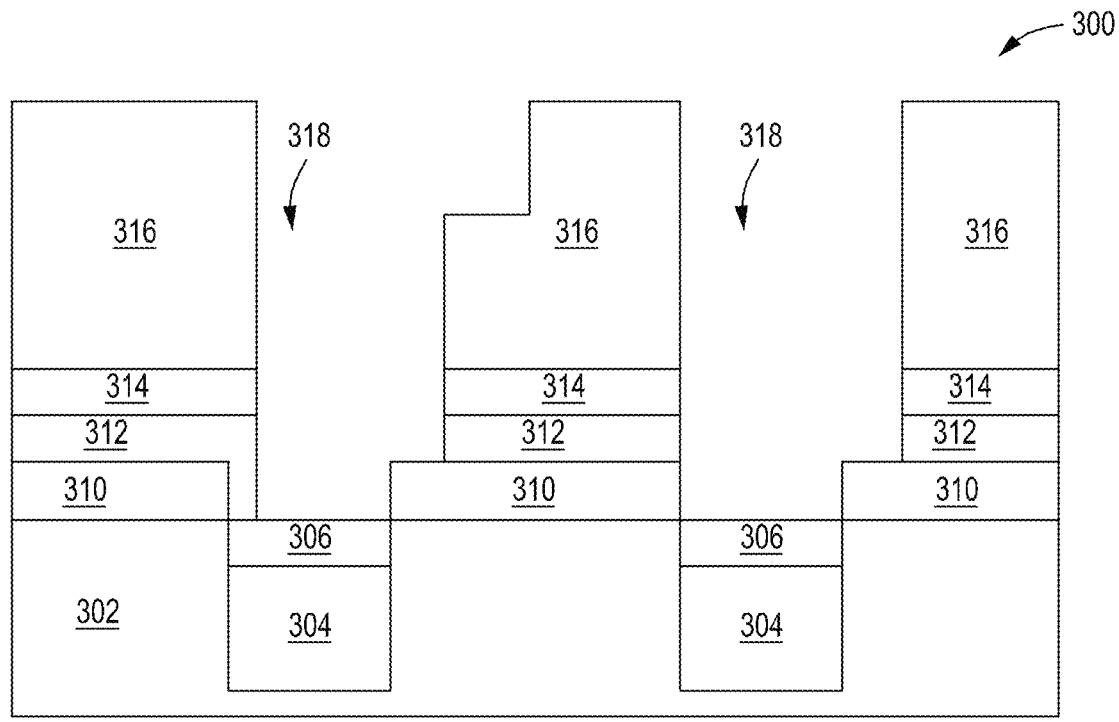

In at least some embodiments, after 110, the method 100 comprises forming a patterned layer 216 (or a patterned layer 316) comprising dielectric material atop one of the aluminum oxide (AlO) layer 214 or the silicon oxycarbonitride (SiOCN) layer 212 (or silicon nitride (SiN) layer) to form a dual damascene on the patterned layer 216 (or a patterned layer 316). For example, in at least some embodiments, the method 100 comprises selectively etching the patterned layer 216 to expose the aluminum oxide (AlO) layer 210 on the dielectric layer 202 or the silicon oxycarbonitride (SiOCN) layer 212 (or silicon nitride (SiN) layer), e.g., to land a via 218 to an etch stop layer, as shown in FIG. 2E. Similarly, in at least some embodiments, the method comprises selectively etching the patterned layer 316 to expose the low-k dielectric layer 310 on the dielectric layer 302, the silicon oxycarbonitride (SiOCN) layer 312 (or silicon nitride (SiN) layer), or the aluminum oxide (AlO) layer 314. For illustrative purposes, the patterned layer 316 is etched to expose the silicon oxycarbonitride (SiOCN) layer 312 (or silicon nitride (SiN) layer), e.g., to land a via 318 to an etch stop layer, as shown in FIG. 3E. Next, the method 100 comprises selectively etching the one of the aluminum oxide (AlO) layer on the dielectric layer or the low-k dielectric layer on the dielectric layer or the one of silicon oxycarbonitride (SiOCN) layer or silicon nitride (SiN) layer to expose one of the aluminum oxide (AlO) layer on the substrate or the metal layer. For example, in at least some embodiments, the method 100 comprises selectively etching the silicon oxycarbonitride (SiOCN) layer 212 (or silicon nitride (SiN) layer) with respect to the aluminum oxide (AlO) layer 210, e.g., to land a via 218 onto the metal layer, the capping layer, and/or the aluminum oxide (AlO) layer, as shown in FIG. 2F. Similarly, in at least some embodiments, the method comprises selectively etching the silicon oxycarbonitride (SiOCN) layer 312 (or silicon nitride (SiN) layer with respect to the low-k dielectric layer 310, e.g., to land a via 318 onto the metal layer, the capping layer, and/or the aluminum oxide (AlO) layer, as shown in FIG. 3F.

After the selectively etching the silicon oxycarbonitride (SiOCN) layer 212 or the silicon oxycarbonitride (SiOCN) layer 312, the respective aluminum oxide (AlO) layer 210 and low-k dielectric layer 310 function as pillars allowing the via 218 and the via 318 to land on the underlaying metal. For example, the selectively etching the silicon oxycarbonitride (SiOCN) layer 212 or the silicon oxycarbonitride (SiOCN) layer 312 allows for vias to land on/expose metal, without shorting (e.g., without landing on/exposing the dielectric layer) and allows enlargement (e.g., about 25%) of the via without shorting, thus increasing cross sectional area of contact and providing lower via resistance (e.g., about 25% to about 50%).

While the foregoing is directed to embodiments of the present disclosure, other and further embodiments of the disclosure may be devised without departing from the basic scope thereof.

The invention claimed is:

1. A method of processing a substrate, comprising:
   a) removing oxide from a metal layer disposed in a dielectric layer on the substrate disposed in a processing chamber;
   b) selectively depositing a self-assembled monolayer (SAM) on the metal layer using atomic layer deposition;
   c) depositing an organo-aluminum precursor while supplying water to form an aluminum oxide (AlO) layer on the dielectric layer;
   d) supplying at least one of hydrogen ($H_2$) or ammonia ($NH_3$) to remove the self-assembled monolayer (SAM); and
   e) depositing one of a silicon oxycarbonitride (SiOCN) layer or a silicon nitride (SiN) layer atop the metal layer and the aluminum oxide (AlO) layer on the dielectric layer.

2. The method of claim 1, wherein the metal layer is at least one of cobalt (Co) or copper (Cu).

3. The method of claim 1, wherein the oxide is metal oxide.

4. The method of claim 1, wherein removing the oxide comprises one of treating the substrate with hydrogen ($H_2$) plasma or soaking the substrate using a thermal process.

5. The method of claim 1, wherein the organo-aluminum precursor comprises neo pentene aluminum.

6. The method of claim 1, wherein the organo-aluminum precursor comprises trimethylaluminum (TMA).

7. The method of claim 1, further comprising purging the at least one of hydrogen ($H_2$) or ammonia ($NH_3$) from a processing volume of the processing chamber.

8. The method of claim 1, further comprising depositing an aluminum oxide (AlO) layer atop the one of the silicon oxycarbonitride (SiOCN) layer or the silicon nitride (SiN) layer.

9. The method of claim 8, further comprising forming a patterned layer comprising dielectric material atop the aluminum oxide (AlO) layer or the one of the silicon oxycarbonitride (SiOCN) layer or the silicon nitride (SiN) layer to form a dual damascene on the patterned layer.

10. The method of claim 9, further comprising selectively etching the patterned layer to expose the aluminum oxide (AlO) layer on the dielectric layer or the one of the silicon oxycarbonitride (SiOCN) layer or the silicon nitride (SiN) layer.

11. The method of claim 10, further comprising selectively etching the aluminum oxide (AlO) layer on the dielectric layer or the one of the silicon oxycarbonitride (SiOCN) layer or the silicon nitride (SiN) layer to expose the aluminum oxide (AlO) layer on the substrate or the metal layer.

12. The method of claim 1, further comprising prior to performing e), repeating a) to d) for a predetermined amount of times.

13. The method of claim 12, wherein the predetermined amount of times is 1 to about 10 times.

14. An apparatus configured for fabricating dual damascene on a substrate, comprising:
   a dielectric layer;
   a metal layer disposed in the dielectric layer;
   an aluminum oxide (AlO) layer on the dielectric layer formed by depositing an organo-aluminum precursor while supplying water to form the aluminum oxide (AlO) layer on the dielectric layer;
   one of a silicon oxycarbonitride (SiOCN) layer or a silicon nitride (SiN) layer atop the metal layer and the aluminum oxide (AlO) layer on the dielectric layer; and
   a via landed to expose at least one of the metal layer or the aluminum oxide (AlO) layer on the dielectric layer, without exposing the dielectric layer.

15. An integrated tool, comprising:
   a plurality of processing chambers configured to:
   a) remove oxide from a metal layer disposed in a dielectric layer on a substrate disposed in a processing chamber;
   b) selectively deposit a self-assembled monolayer (SAM) on the metal layer using atomic layer deposition;
   c) deposit an organo-aluminum precursor while supplying water to form one an aluminum oxide (AlO) layer on the dielectric layer;
   d) supply at least one of hydrogen ($H_2$) or ammonia ($NH_3$) to remove the self-assembled monolayer (SAM); and
   e) deposit one of a silicon oxycarbonitride (SiOCN) layer or a silicon nitride (SiN) layer atop the metal layer and the aluminum oxide (AlO) layer on the dielectric layer.

16. The integrated tool of claim 15, wherein the metal layer is at least one of cobalt (Co) or copper (Cu).

17. The integrated tool of claim 15, wherein the oxide is metal oxide.

18. The integrated tool of claim 15, wherein the plurality of processing chambers are further configured to one of treat the substrate with hydrogen ($H_2$) plasma or soak the substrate using a thermal process.

19. The integrated tool of claim 15, wherein the organo-aluminum precursor comprises neo pentene aluminum.

20. The integrated tool of claim 15, wherein the organo-aluminum precursor comprises trimethylaluminum (TMA).

* * * * *